Sept. 23, 1969 B. L. JONES 3,469,200
PLURAL STAGE TRANSISTOR AMPLIFIER WITH D.C. FEEDBACK
Filed Aug. 17, 1965
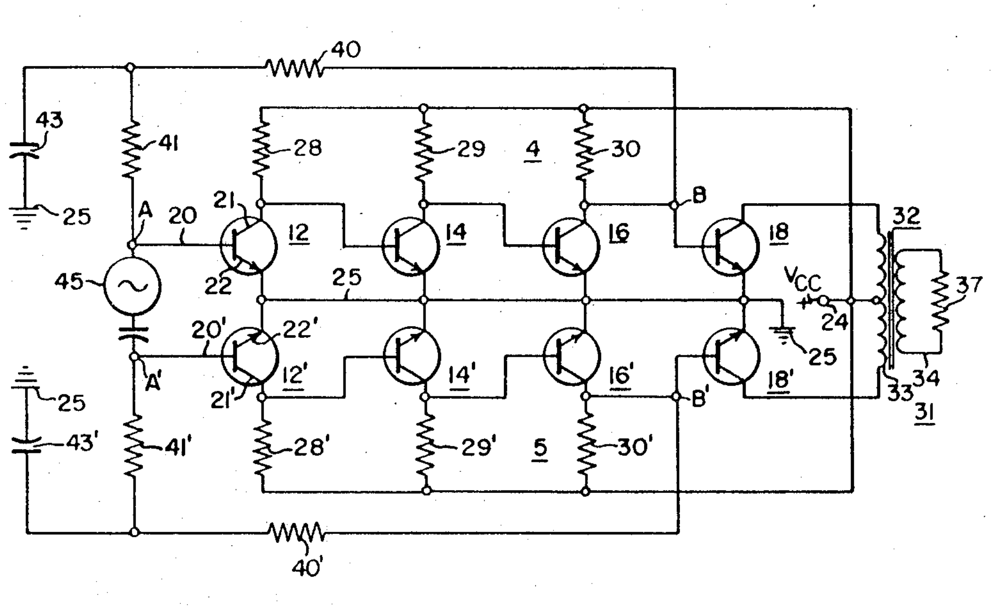
WITNESSES:
John L. Chopp
James T. Young
INVENTOR
Brian L. Jones
BY Dean Schron
ATTORNEY

3,469,200
PLURAL STAGE TRANSISTOR AMPLIFIER WITH D.C. FEEDBACK

Brian L. Jones, State College, Pa., assignor to Westinghouse Electric Corporation, Pittsburgh, Pa., a corporation of Pennsylvania Filed Aug. 17, 1965, Ser. No. 480,333
Int. Cl. H03f 3/26
U.S. Cl. 330—15 2 Claims

ABSTRACT OF THE DISCLOSURE

An amplifier system including a plurality of direct coupled cascaded transistor stages including a first stage transistor to which an input signal is applied and a last or output stage transistor having an output load means in its collector-emitter circuit. The base of the output transistor is connected to the base of the input transistor by way of a D.C. feedback circuit for accurate regulation of the base bias of the output transistor.

This invention in general relates to amplifier systems and more particularly to a low power, direct coupled, temperature stabilized, audio amplifier system which may be fabricated as an integrated circuit.

Technological advancements in the semiconductor art have led to the field of molecular electronics, also known by other names such as integrated circuitry, wherein a plurality of the electrical components are formulated on a single piece of semiconductor crystal. Circuits formulated by molecular electronic techniques range from the very simple, which may only include a few diodes, to the very complex including entire amplifier systems. Since the semiconductor chip upon which the circuit is formulated is very tiny, present day technology is limited to the value of capacitors which may be made for a given chip size. For this reason, the fabrication of linear amplifiers, in integrated circuit form, presents several design problems in that interstage coupling capacitors are normally too large to be incorporated in the molecular circuit. For this reason, a great number of audio amplifiers are made, utilizing direct coupling between stages.

Direct coupled amplifiers require exacting D.C. bias levels at various points in the amplifier system. Severely hampering of the operation of direct coupled amplifiers is the fact that various parameters vary with temperature and therefore excessive and unwanted drifts caused by variation of transistor biases occur with variations in temperature. Although the transistor parameters per se are not excessively responsive to temperature, they vary with emitter current and collector-emitter voltage so that if these vary excessively with temperature, they will in turn produce a variation of the transistor parameters.

In order to stabilize the direct coupled amplifier system with respect to temperature, various direct coupled circuits employ a feedback arrangement wherein an emitter resistor is inserted in series with the emitter of the output transistor of the amplifier. This type of stabilization is highly unsatisfactory in circuits using a single and low valued power supply such as might be found in integrated circuits where the supply battery might be in the order of 1 or 1.5 volts. Since the power supply is limited, the voltage drop across an emitter resistor produced by signal currents in the transistor would represent waste since it reduces the power available for the output signal.

For output circuits operating in a push-pull arrangement it is additionally desirable to maintain a correct bias in order to minimize or eliminate crossover distortion.

It is, therefore, a primary object of the present invention to provide an improved temperature stabilized direct coupled audio amplifier system.

Another object is to provide a direct coupled amplifier which is stabilized without the need for an emitter resistor in the output transistor.

Another object is to provide a temperature stabilized direct coupled audio amplifier system which may operate properly with an extremely small power supply.

Another object is to provide a direct coupled audio amplifier system which is particularly well adapted to be fabricated as an integrated circuit.

Another object is to provide a temperature stabilized audio amplifier system without the need for sampling the output signal.

Briefly, in accordance with the above objects, there is provided an amplifier system having a plurality of direct coupled cascaded stages including an input transistor as the first stage and an output transistor as a last stage. The base electrode of each of the transistors is directly connected to the collector electrode of a previous transistor, except for the input transistor which receives an input signal. An output load means is connected in the collector-emitter circuit of the output transistor, the base of which is additionally connected to the base of the input transistor by way of feedback resistance means. The feedback action insures that the base bias condition of the output transistor is regulated, and consequently the collector current thereof will be regulated without the need for an output emitter resistance and without the need for sampling the output current.

To obtain similar base-emitter voltage drops in the various transistors in addition to insuring similar drifts with respect to temperature, of the various transistors, the amplifier system is preferably fabricated as an integrated circuit.

The above stated as well as further objects and advantages of the present invention will become apparent upon a reading of the following detailed specification taken in conjunction with the drawing, illustrating an amplifier system incorporating the present invention.

The basic circuit includes a plurality of direct coupled cascaded transistors 12, 14, 16 and 18 with transistor 12 constituting an input transistor, and transistor 18 constituting an output transistor. Transistor 12, as well as the other transistors, includes an input or a base electrode 20, an output or collector electrode 21 and a common or emitter electrode 22. The term amplifier, or amplifier system, utilized herein is meant to include both amplifiers and preamplifiers.

Each of the transistors 12, 14 and 16 has a corresponding collector resistor 28, 29 and 30 respectively, each of which is connected to terminal means 24 to which may be applied a suitable source of operating potential $V_{CC}$. The respective emitter electrodes of these transistors as well as the emitter electrode of transistor 18 are connected to a common circuit point illustrated as ground 25.

The basic circuit is utilized, by way of example, in a symmetrical arrangement wherein transistors 12, 14, and 16 may constitute a preamplifier, and transistor 18, an output amplifier stage of a first channel, 4. The symmetrical components, including transistors 12', 14', 16' and 18' are identical to their unprimed counterparts and form a second channel, 5.

The output transistor 18, and its symmetrical counterpart 18' is connected to a load means 31 illustrated by way of example as comprising transformer 32 having a primary winding 33 and a secondary winding 34. Each end of the primary winding 33 is connected to a respective output transistor collector electrode and the center tap of primary winding is connected to terminal 24. The secondary winding 34 is connected to a load impedance 37. With the circuit utilized as an audio amplifier, the output means 31 may constitute a speaker or ear plug arrangement. Alternatively, the output means could include a bridge type, or differential output, arrangement.

The base of input transistor 12 has been labeled A, and the base of output transistor 18 has been labeled B. Feedback means have been provided in a well known manner, connecting point A with point B, and take the form of resistors 40 and 41 with the junction therebetween being capacitively coupled by means of capacitor 43, to ground 25 to filter out any A.C. component so that a pure D.C. feedback is obtained. An input signal source 45 is capacitively coupled to both of inputs 20 and 20′ constituting the base electrode of transistors 12 and 12′ respectively. In a typical application as an audio amplifier, the input signal source 45 is a microphone.

The circuit finds particular application for use in extremely small hearing aids and when formulated as an integrated circuit, the power supply $V_{CC}$ would be in the order of 1.5 volts. For the amplifier system illustrated, as well as other transistor systems, the transistors must be biased at a certain D.C. quiescent biasing point which must be accurately maintained in spite of varying temperature tending to cause parameter and current variations. In the circuit the D.C. bias condition will be accurately maintained by maintaining prescribed conditions at point A (the base of transistor 12). Since point A is resistively connected to point B, the conditions at point B, and consequently the base bias conditions of transistor 18, are accurately maintained.

The preamplifier section comprising transistors 12, 14 and 16 is a standard well-known direct coupled feedback network having an odd number of stages. Basically, if any of the D.C. operating points tend to vary, the feedback action will be operative to bring the circuit back to its quiescent operating point. By way of example, suppose that the voltage at point B tends to rise due to some objectionable temperature variation. This increase in voltage is fed back to the base of input transistor 12 via resistors 40 and 41. An increasing base voltage causes the output voltage at the collector of transistor 12 to decrease, thus decreasing the input signal to transistor 14, the output voltage of which rises and is applied to the input of transistor 16 to thereby bring the voltage back down to its designed operating point. Conversely, suppose that the voltage at point B decreases. A similar type of operation occurs to again bring back the operating point B to its quiescent value. A decreasing voltage at point B applied to the input transistor 12 causes the output thereof to increase. The increasing output signal applied to transistor 14 causes its output in turn to decrease which when fed to transistor 16 causes an increased output signal therefrom, thereby bringing up the signal to its designed value. The unique cooperation of the output stage with this standard circuit serves to control the D.C. quiescent operating current in the collector-emitter current path of the output transistor 18 by actually controlling the base bias conditions of the transistor 18. This accurate control of the output transistor 18 is accomplished without the need for a large emitter resistor which would provide an objectionable voltage drop when input signals are supplied by the microphone 45. By virtue of the combination, the D.C. quiescent current of the output transistor 18 is additionally maintained without the need for sampling and feeding back any output signal from the output transistor 18.

When both of the channels 4 and 5 are utilized, as illustrated in the figure, the microphone 45 applies input signals to the base electrode of both input transistors 12 and 12′. With an input signal differentially applied, as illustrated, channel 4 amplifies positive going signals at the same time that channel 5 amplifies negatively going signals and vice versa. In other words, the signals being amplified in each of the channels are 180° out of phase. With this arrangement, the two output transistors 18 and 18′ are driven in an out-of-phase relationship by the signals in channels 4 and 5, respectively. The output means is connected in the output circuit of both of these transistors. The primary winding 33 of output means 31 has one end connected to the collector electrode of output transistor 18 and has the other end thereof connected to the collector electrode of output transistor 18′.

Accordingly, there has been provided a temperature stabilized D.C. amplifier which may be fabricated by integrated circuit techniques and which will operate at a very low value of power supply since the need for a feedback emitter resistor from the output transistor has been eliminated. Inclusion of the emitter resistor would represent a waste since it would reduce the power available for the output signal. The D.C. quiescent operating points of the amplifier are maintained despite temperature variations. The bias condition in the output circuit of the output transistor is maintained by the accurate control of the base conditions of the output transistor.

Although the invention has been described with a certain degree of particularity, it is to be understood that modifications may be made thereto without departing from the spirit and scope of the invention, but that other embodiments are made possible in light of the above teachings.

What is claimed is:

1. In combination:

a preamplifier including an odd number of direct coupled transistor stages;

D.C. feedback means connecting the output electrode of a last of said transistors to the input electrode of a first of said transistors for feeding back signals appearing at said output electrode and including means providing an A.C. path to ground for filtering out any A.C. components of said signals;

an amplifier stage including an output transistor; and the input electrode of said output transistor being connected to said output electrode of said last of said transistors of said preamplifier.

2. An amplifier system comprising:

a plurality of direct coupled transistors each having their emitter electrode connected to a common circuit point, a first of said transistors constituting an input transistor and a last of said transistors constituting an output transistor;

D.C. feedback means connecting the base electrode of said output transistor with the base electrode of said input transistor for feeding back signals appearing at said base electrode and including means providing an A.C. path to ground for filtering out any A.C. components of said signals;

terminal means for applying a suitable source of bias potential to said transistors;

a load means connecting the collector electrode of said output transistor with said terminal means; and means connecting each of the collector electrodes of the remaining of said transistors with said terminal means.

References Cited

UNITED STATES PATENTS 3,030,586 4/1962 Paz et al. ............ 330—19

FOREIGN PATENTS 230,759 11/1958 Australia.

ROY LAKE, Primary Examiner

S. H. GRIMM, Assistant Examiner

U.S. Cl. X.R.

330—19, 25